(12) United States Patent
Lee

(10) Patent No.: US 11,327,839 B2
(45) Date of Patent: May 10, 2022

(54) STORAGE DEVICE AND METHOD OF OPERATING THE SAME

(71) Applicant: SK hynix Inc., Gyeonggi-do (KR)

(72) Inventor: Hyun Woo Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 15 days.

(21) Appl. No.: 17/006,062

(22) Filed: Aug. 28, 2020

(65) Prior Publication Data
US 2021/0311830 A1    Oct. 7, 2021

(30) Foreign Application Priority Data
Apr. 6, 2020    (KR) .................. 10-2020-0041659

(51) Int. Cl.
| G06F 11/10 | (2006.01) |
| G06F 3/06 | (2006.01) |
| G11C 16/26 | (2006.01) |
| G11C 16/04 | (2006.01) |

(52) U.S. Cl.
CPC ........ G06F 11/1076 (2013.01); G06F 3/0619 (2013.01); G06F 3/0659 (2013.01); G06F 3/0673 (2013.01); G11C 16/0483 (2013.01); G11C 16/26 (2013.01)

(58) Field of Classification Search
CPC .. G06F 11/1076; G06F 3/0619; G06F 3/0659; G06F 3/0673; G11C 16/0483; G11C 16/26
USPC .......................... 714/764, 765, 768, 769, 770
See application file for complete search history.

(56) References Cited

U.S. PATENT DOCUMENTS

| 2015/0121128 A1* | 4/2015 | Li .................. G06F 11/073 |
| | | 714/6.11 |
| 2016/0253124 A1* | 9/2016 | Kim .................. G11C 16/10 |
| | | 711/103 |
| 2017/0147209 A1* | 5/2017 | Lee .................. G06F 3/0659 |
| 2018/0032282 A1* | 2/2018 | Hahn .................. G06F 3/0604 |
| 2019/0102088 A1* | 4/2019 | Fang .................. G06F 11/1004 |
| 2019/0266045 A1* | 8/2019 | Sato .................. G06F 11/108 |
| 2020/0064897 A1* | 2/2020 | Nomura ............. G11C 16/3445 |
| 2020/0202935 A1* | 6/2020 | Lin .................. G11C 16/26 |
| 2020/0227120 A1* | 7/2020 | Lin .................. G11C 16/349 |

FOREIGN PATENT DOCUMENTS

| KR | 10-2017-0111572 | 10/2017 |
| KR | 10-2018-0110412 | 10/2018 |

* cited by examiner

*Primary Examiner* — Guy J Lamarre
(74) *Attorney, Agent, or Firm* — IP & T Group LLP

(57) ABSTRACT

The present technology relates to an electronic device. According to the present technology, a storage device having improved original data recovery capability may include a memory device including a plurality of memory cells, and configured to perform a read operation on data stored in the plurality of memory cells according to read mode information, and to output read data associated with the read operation and a memory controller configured to receive the read data, change the read mode information when error correction decoding for the read data fails, and control the memory device to perform the read operation again according to the changed read mode information. The read mode information may include information on a data interface between the memory device and the memory controller.

20 Claims, 11 Drawing Sheets

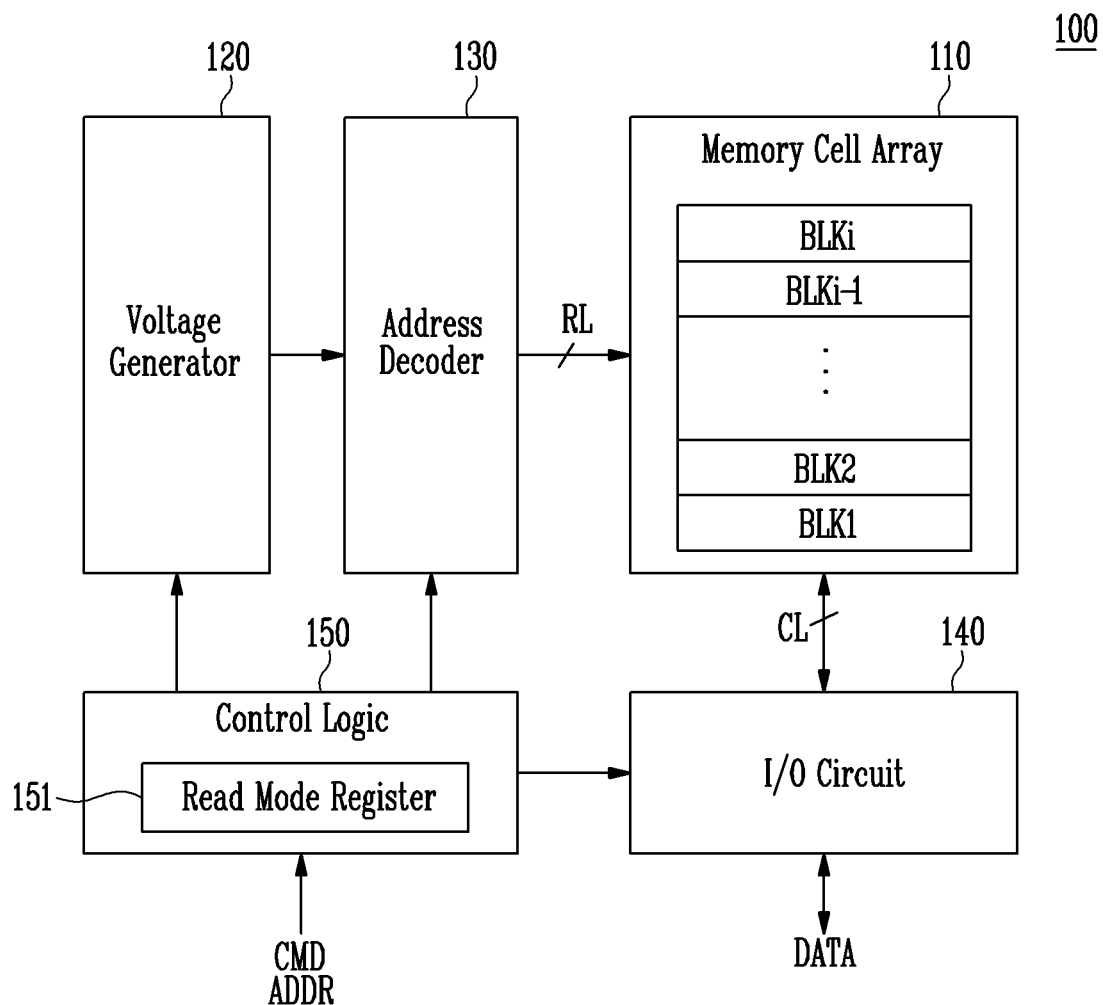

FIG. 12

| Physical Address | Recovery Algorithm | Data Interface Information | Power Information (External) | Power Information (Internal) |
|---|---|---|---|---|
| PA1 | RA2 | SDR mode | External Power 1 | Internal Power 1 |
| PA2 | RA3 | DDR mode | External Power 2 | Internal Power 2 |
| PA3 | RA1 | DDR mode | External Power 1 | Internal Power 1 |
| ... | ... | ... | ... | ... |

213-3

STORAGE DEVICE AND METHOD OF OPERATING THE SAME

CROSS-REFERENCE TO RELATED APPLICATION

The present application claims priority under 35 U.S.C. § 119(a) to Korean patent application number 10-2020-0041659, filed on Apr. 6, 2020, which is incorporated herein by reference in its entirety.

BACKGROUND

1. Field of Invention

The present disclosure relates to an electronic device, and more particularly, to a storage device and a method of operating the same.

2. Description of Related Art

A storage device stores data under control of a host device such as a computer or a smartphone. A storage device may include a memory device storing data and a memory controller controlling the memory device. The memory device may be a volatile memory device or a non-volatile memory device.

A volatile memory device stores data only when power is supplied and loses the stored data when the power supply is cut off. Examples of volatile memory devices include a static random access memory (SRAM), a dynamic random access memory (DRAM), and the like.

A non-volatile memory device does not lose stored data even when power is cut off. Examples of non-volatile memory devices include a read only memory (ROM), a programmable ROM (PROM), an electrically programmable ROM (EPROM), an electrically erasable and programmable ROM (EEPROM), a flash memory, and the like.

SUMMARY

An embodiment of the present disclosure provides a storage device having improved original data recovery capability, and a method of operating the same.

A storage device according to an embodiment of the present disclosure may include a memory device including a plurality of memory cells, and configured to perform a read operation on data stored in the plurality of memory cells according to read mode information, and to output read data associated with the read operation and a memory controller configured to receive the read data, change the read mode information when error correction decoding for the read data fails, and control the memory device to perform the read operation again according to the changed read mode information. The read mode information may include information on a data interface between the memory device and the memory controller.

A storage device according to an embodiment of the present disclosure may include a memory device including a memory block including a plurality of pages, and configured to perform a read operation on a selected page among the plurality of pages according to read mode information, and to output read data associated with the read operation and a memory controller configured to receive the read data and control the memory device to sequentially performing a plurality of recovery algorithms for recovering data stored in the selected page according to a set sequence when error correction decoding for the read data fails, wherein the memory controller controls the memory device to change the read mode information while at least one of the plurality of recovery algorithms is performed.

A storage device according to an embodiment of the present disclosure may include a memory device including a plurality of memory cells and a controller configured to control the memory device to perform a read operation on the plurality of memory cells based on read mode information decode read data associated with the read operation, and change the read mode information, when it is determined that the decoding of the read data has failed control the memory device to perform a read retry operation on the plurality of memory cells based on the changed read mode information, wherein the read mode information includes at least one of data rate between the memory device and the controller and a power level for the memory device.

According to the present technology, a storage device having improved original data recovery capability, and a method of operating the same are provided.

BRIEF DESCRIPTION OF THE DRAWINGS

FIG. 5 is a diagram illustrating a memory device, such as that of FIG. 1.

FIG. 6 is a diagram illustrating a read mode register, such as that of FIG. 5.

FIG. 12 is a diagram illustrating another embodiment of a read mode information storing circuit of FIG. 3 or FIG. 10.

DETAILED DESCRIPTION

Specific structural and functional description is provided only to describe embodiments of the present disclosure. However, aspects and features of the present invention may be carried out or implemented in various other ways or forms, the present invention is not limited to or by any of the disclosed embodiments nor any specific description herein. Also, throughout the specification, reference to "an embodiment," "another embodiment" or the like is not necessarily to only one embodiment, and different references to any such phrase are not necessarily to the same embodiment(s).

Figure 1:
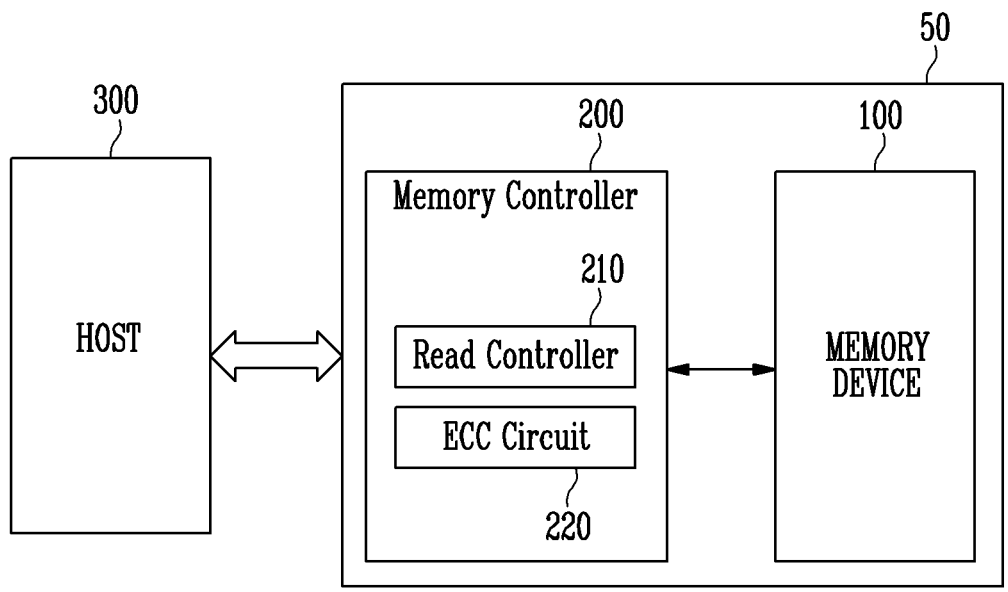
FIG. 1 is a diagram illustrating a storage device according to an embodiment of the present disclosure.

FIG. 1 is a diagram illustrating a storage device according to an embodiment of the present disclosure.

Referring to FIG. 1, the storage device 50 may include a memory device 100 and a memory controller 200 that controls an operation of the memory device 100. The storage device 50 may store data under control of a host 300 such as a cellular phone, a smartphone, an MP3 player, a laptop computer, a desktop computer, a game player, a television (TV), a tablet personal computer (PC), or an in-vehicle infotainment system.

The storage device 50 may be configured as any of various types of storage devices according to a host interface that is a communication method with the host 300. For example, the storage device 50 may be configured as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-e or PCIe) card type storage device, a compact flash (CF) card, a smart media card, and/or a memory stick.

The storage device 50 may be manufactured as any of various types of packages. For example, the storage device 50 may be manufactured as a package on package (POP), a system in package (SIP), a system on chip (SOC), a multi-chip package (MCP), a chip on board (COB), a wafer-level fabricated package (WFP), and/or a wafer-level stack package (WSP).

The memory device 100 may store data. The memory device 100 operates under control of the memory controller 200. The memory device 100 may include a memory cell array (not shown) including a plurality of memory cells that store data.

Each of the memory cells may be configured as a single level cell (SLC) that stores one data bit, a multi-level cell (MLC) that stores two data bits, a triple level cell (TLC) that stores three data bits, or a quad level cell (QLC) capable of storing four data bits.

The memory cell array (not shown) may include a plurality of memory blocks. One memory block may include a plurality of pages. In an embodiment, the page may be a unit for storing data in the memory device 100 or reading data stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change random access memory (PRAM), a magnetoresistive random access memory (MRAM), a ferroelectric random access memory (FRAM), a spin transfer torque random access memory (STT-RAM), or the like. In the present specification, by way of example, the present invention is described in the context in which the memory device 100 is a NAND flash memory.

The memory device 100 is configured to receive a command CMD and an address ADDR from the memory controller 200 and access an area selected by an address in the memory cell array. The memory device 100 may perform an operation instructed by the command CMD on the area selected by the address ADDR. For example, the memory device 100 may perform a write operation (program operation), a read operation, and an erase operation. During the program operation, the memory device 100 may program data in the area selected by the address ADDR. During the read operation, the memory device 100 may read data from the area selected by the address ADDR. During the erase operation, the memory device 100 may erase data stored in the area selected by the address ADDR.

The memory controller 200 may control overall operation of the storage device 50.

When power is applied to the storage device 50, the memory controller 200 may execute firmware (FW). When the memory device 100 is a flash memory device, the memory controller 200 may execute firmware such as a flash translation layer (FTL) for controlling communication between the host 300 and the memory device 100.

In an embodiment, the memory controller 200 may receive data and a logical block address (LBA) from the host 300 and may convert (or translate) the LBA into a physical block address (PBA) indicating an address of memory cells in which data in the memory device 100 is to be stored.

The memory controller 200 may control the memory device 100 to perform the program operation, the read operation, or the erase operation according to a request of the host 300. During the program operation, the memory controller 200 may provide a write command, the PBA, and data to the memory device 100. During the read operation, the memory controller 200 may provide a read command and the PBA to the memory device 100. During the erase operation, the memory controller 200 may provide an erase command and the PBA to the memory device 100.

In an embodiment, the memory controller 200 may generate a command, an address, and data independently, i.e., without a request from the host 300, and transmit the command, the address, and the data to the memory device 100. For example, the memory controller 200 may provide a command, an address, and data for performing a read operation and program operations for performing wear leveling, read reclaim, garbage collection, and the like, to the memory device 100.

In an embodiment, the memory controller 200 may control two or more memory devices 100. In this case, the memory controller 200 may control the memory devices 100 according to an interleaving method to improve operation performance. The interleaving method may control operations, or portions thereof, of at least two memory devices 100 such that the operations, or portions thereof, overlap in terms of time.

In an embodiment, the memory controller 200 may include a read controller 210 and an error correction (ECC) circuit 220.

The read controller 210 may generally control the read operation of reading data stored in the memory device 100. The read controller 210 may provide the read command and a PBA to be read, to the memory device 100.

The memory device 100 may perform the read operation of sensing data stored in a page indicated by the PBA to be read, in response to the read command.

Thereafter, the read controller 210 may provide a data output command requesting an output of the read data to the memory device 100. The read controller 210 may receive read data output by the memory device 100 in response to a data output command, and provide the received read data to the error correction circuit 220.

The error correction circuit 220 may sense an error in the read data and correct the sensed error. An operation in which the error correction circuit 220 senses and corrects the error in the read data is referred to as an error correction decoding operation. The error correction circuit 220 has a specific error correction capability according to a type and a size of the error correction code used. When the read data is within the error correction capability of the error correction code, error correction for the read data passes and error(s) in the read data may be corrected, and original data may be recovered. When the error correction decoding fails, that means that the number of errors in the read data exceeds the error correction capability of the error correction circuit 220, in which case error correction is not performed on the read data.

The read controller 210 may control the memory device 100 to perform any of various recovery algorithm operations for recovering the original data when error correction decoding for read data obtained by the read operation fails.

The plurality of recovery algorithms may be performed according to a set sequence. As the complexity of the recovery algorithm performed increases, the probability of obtaining the original data increases, but the number of operations or computations to be performed by the memory controller 200 also increases, thus increasing overhead. In an embodiment, the read controller 210 may perform the recovery algorithms in a sequence from a relatively low complexity recovery algorithm to a relatively high complexity recovery algorithm. When the original data is obtained by any one recovery algorithm, advantageously remaining recovery algorithms, which have incrementally higher complexities, need not be performed.

In an embodiment, the plurality of recovery algorithms may include read retry, optimum read voltage retry, soft decoding, a chip kill recovery operation, and the like.

The read retry may include an operation of retrying the read operation using a read voltage different than the default read voltage previously used. The read voltage used in the read retry may be stored in the memory device 100 or the memory controller 200 in advance.

The optimum read voltage retry may include an operation of calculating an optimum read voltage and performing the read operation again using the calculated optimum read voltage. Here, the optimum read voltage may be calculated by various methods. In an embodiment, the optimum read voltage may be calculated using Gaussian modeling. Alternatively, the optimum read voltage may be determined from among multiple read voltages according to the number of 0's or 1's in the data read using such voltages.

The soft decoding may include an operation of performing read operations using a plurality of soft read voltages, which may be determined based on the default read voltage or the optimum read voltage. For example, the plurality of soft read voltages may be voltages, some of which are greater than the default read voltage or the optimum read voltage and others of which are lower. In this case, there may be fixed difference between adjacent read voltages.

The chip kill recovery operation may include an operation of recovering data stored in a page where the read operation failed using data of other pages.

The above-described recovery algorithms generally include operations of repeatedly performing the read operation with a different read voltage each time, or controlling the memory device 100 to read a page different from the page where the read operation is failed.

However, instead of applying recovery algorithms to recover the original data by changing the read voltage or changing an object to be read, the storage device 50 may change read mode information, that is, setting information of the storage device 50, when the read operation is performed and may perform the read operation again according to the changed read mode information. The read mode information may be changed whenever any recovery algorithm is performed, or may be changed only when a specific recovery algorithm is performed.

In an embodiment, the read mode information may include information on a data interface between the memory device 100 and the memory controller 200. In various embodiments, the read mode information may include external power information that is information on a magnitude of an external voltage input to the memory device 100, or internal power information that is information on a magnitude of an internal voltage to be generated by the memory device 100. In addition, the read mode information may include all of various setting information of the storage device 50 when the read operation is performed except for a change of the read voltage.

Detailed method of changing the read mode information is described below in more detail with reference to FIGS. 3 to 12.

According to embodiments of the present disclosure, the original data may be more easily recovered using setting information of the storage device 50 than changing the threshold voltage of the memory cells of the memory device 100.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and/or a load reduced DIMM (LRDIMM).

Figure 2:
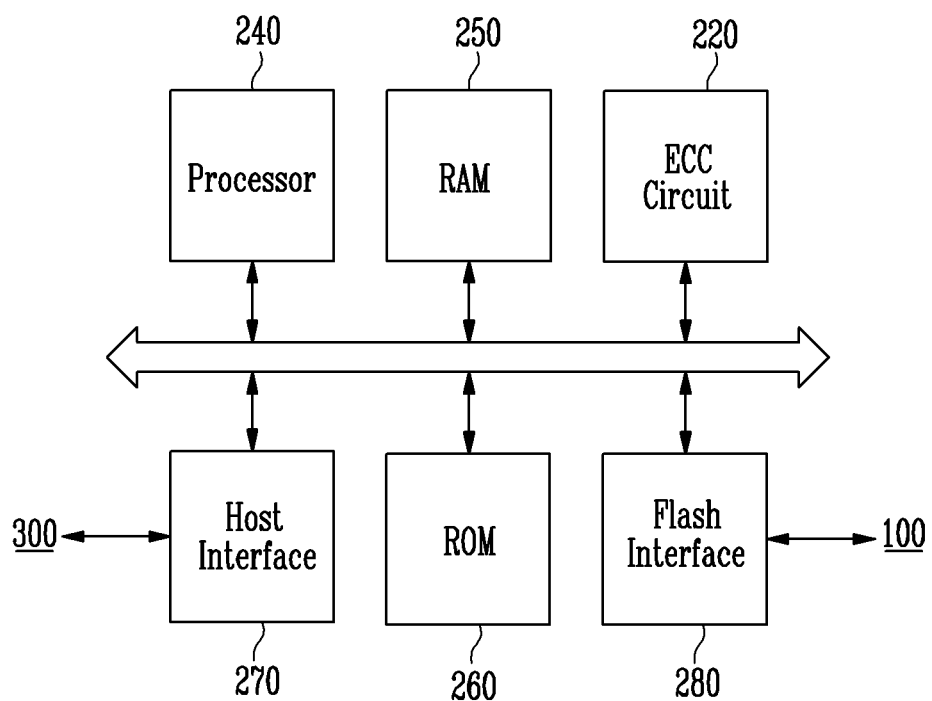
FIG. 2 is a diagram illustrating an embodiment of a memory controller of FIG. 1.

FIG. 2 is a diagram illustrating an embodiment of the memory controller 200 of FIG. 1.

Referring to FIGS. 1 and 2, the memory controller 200 may include an error correction (ECC) circuit 220, a processor 240, a random access memory (RAM) 250, a read only memory (ROM) 260, a host interface 270, and a flash interface 280.

The processor 240 may control overall operation of the memory controller 200. The RAM 250 may be used as a buffer memory, a cache memory, and/or an operation memory of the memory controller 200. For example, the read controller 210 described with reference to FIG. 1 may be provided in software form. The software-implemented read controller 210 may be stored in the RAM 250 and may be driven by the processor 240.

The ROM 260 may store various information required for the memory controller 200 to operate in firmware form. For example, a firmware-implemented read controller 210 may be stored in the ROM 260, and driven by the processor 240.

The memory controller 200 may communicate with an external device (for example, the host 300, an application processor, or the like) through the host interface 270.

The memory controller 200 may communicate with the memory device 100 through the flash interface 280. The memory controller 200 may transmit a command CMD, an address ADDR, and a control signal CTRL to the memory device 100 through the flash interface 280 and receive data DATA. For example, the flash interface 280 may include a NAND interface.

Figure 3:
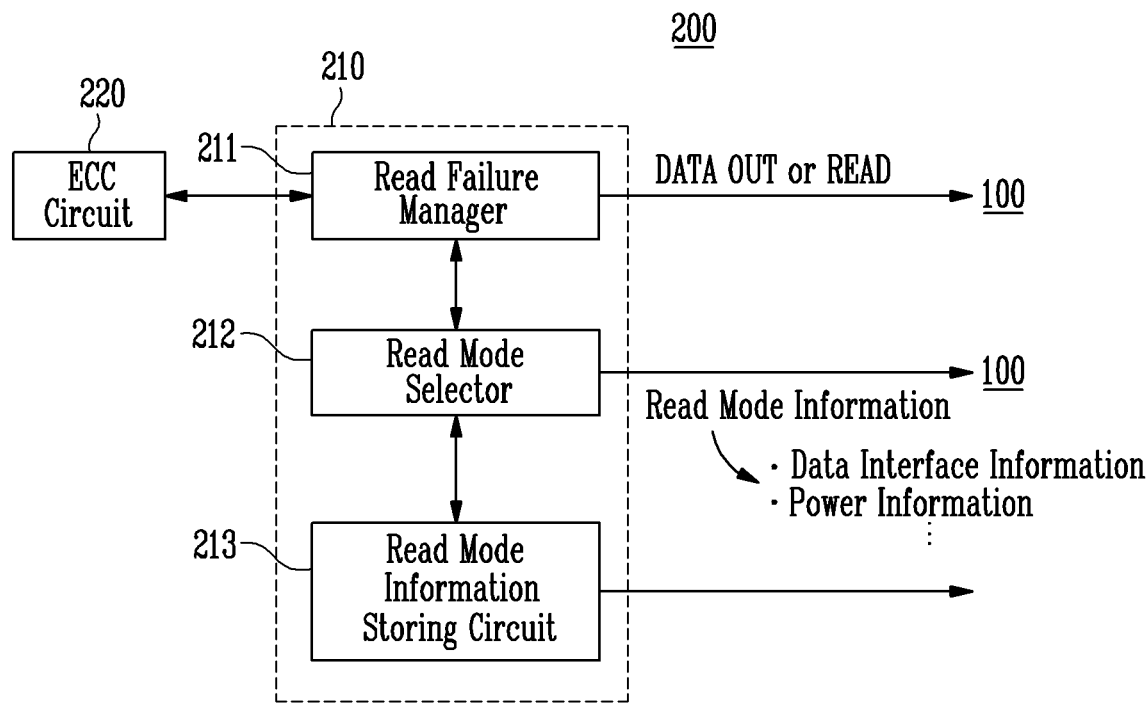
FIG. 3 is a diagram illustrating an embodiment of a read controller of FIG. 1.

FIG. 3 is a diagram illustrating an embodiment of the read controller 210 of FIG. 1.

Referring to FIG. 3, the read controller 210 may include a read failure manager 211, a read mode selector 212, and a read mode information storing circuit 213.

The read failure manager 211 may sense that a read operation failed. Specifically, the read failure manager 211 may provide read data received from the memory device 100 to the error correction circuit 220 and receive therefrom information as to whether an error correction decoding operation passed (succeeded). The read failure manager 211 may control the read mode selector 212 to change the read mode information when the error correction decoding for the read data failed.

The read mode information may be the setting information of the storage device 50 when the read operation is performed. For example, the read mode information may include a plurality of read mode items. The plurality of read mode items may include information on the data interface between the memory device 100 and the memory controller 200, which may indicate the data rate, for example, a single data rate (SDR) or a double data rate (DDR). In various embodiments, the information on the data interface may include information indicating a double data rate 2 (DDR2) or a double data rate 3 (DDR3).

In an embodiment, the plurality of read mode items may include the external power information that is the information on the magnitude of the external voltage input to the memory device 100 and/or the internal power information that is the information on the magnitude of the internal voltage to be generated by the memory device 100.

Table 1 shows examples of the read mode items and the read mode information corresponding thereto.

TABLE 1

| Data Interface Information | Power Information (External) | Power Information (Internal) |
|---|---|---|
| SDR mode | External Power 1 | Internal Power 1 |
| DDR mode | External Power 2 | Internal Power 1 |
| DDR2 mode | External Power 3 | Internal Power 2 |
| DDR3 mode | External Power 4 | Internal Power 2 |
| . | . | . |
| . | . | . |
| . | . | . |

According to [Table 1], the information on the data interface (i.e., Data Interface Information) may indicate any one of the SDR mode, the DDR mode, the DDR2 mode, or the DDR3 mode as the read mode information.

The external power information (i.e., Power Information (External)) may indicate any one of a first external power (i.e., External Power 1) to a fourth external power (i.e., External Power 4) as the read mode information.

The internal power information (i.e., Power Information (Internal)) may indicate any one of a first internal power (i.e., Internal Power 1) or a second internal power (i.e., Internal Power 2) as the read mode information.

Table 1 shows an example of the read mode information. In addition, setting information such as input/output impedance information and driving strength may be included in the read mode information.

The read mode selector 212 may provide the read mode information changed under control of the read failure manager 211 to the memory device 100. In an embodiment, the read mode selector 212 may provide the read mode information to the memory device 100 using a set feature command defined in the NAND flash interface.

In various embodiments, the read mode selector 212 may first provide a reset command to the memory device 100 before providing the changed read mode information to the memory device 100. In this case, since the memory device 100 is required to perform the read operation again, the read failure manager 211 may transmit a read command READ again to the memory device 100.

When the reset command is not provided to the memory device 100 before changing the read mode information, data according to a previous read operation may be maintained in the memory device 100, and thus the read failure manager 211 may provide a data output command DATA OUT to the memory device 100.

Whether the read mode selector 212 provides the reset command to the memory device 100 may be determined according to a type of the read mode information to be changed.

The read mode information storing circuit 213 may store the read mode information. The read mode selector 212 may control the read mode information storing circuit 213 to provide the changed read mode information to the memory device 100 and store the changed read mode information in the read mode information storing circuit 213.

Figure 4:
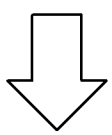
FIG. 4 is a diagram illustrating a read mode information storing circuit, such as that of FIG. 3.

FIG. 4 is a diagram illustrating the read mode information storing circuit of FIG. 3.

Referring to FIG. 4, when power is supplied to the storage device 50, the read failure manager 211 may load the read mode information stored in the memory device 100 in advance to the read mode information storing circuit 213.

First read mode information 213-1 may be default read mode information that is initially used. In an embodiment, whenever the read mode information is updated, the read mode information may be stored in the memory device 100. Therefore, the first read mode information 213-1 may be last updated read mode information before the power is turned off.

According to the first read mode information 213-1, the storage device 50 communicates with the memory device 100 and the memory controller 200 using the DDR mode, and performs the read operation in a state in which the external power of the memory device 100 is used as second external power and the internal power is used as a voltage level corresponding to second internal power.

As a result of performing the read operation according to the first read mode information 213-1, when the error correction decoding fails, the read mode selector 212 may change the read mode information as described through FIG. 3, and may store second read mode information 213-2, which is the changed read mode information, in the read mode information storing circuit 213.

In the second read mode information 213-2, communication between the memory device 100 and the memory controller 200 is performed in the SDR mode, which is slower than the DDR mode of the first read mode information 213-1, first external power (i.e., External Power 1)

having a voltage level higher than that of the second external power (i.e., External Power 2) may be used, and first internal power (i.e., Internal Power 1) having a voltage level higher than that of the second internal power (i.e., Internal Power 2) may be used.

As a result of the storage device performing the read operation in a high speed/low power environment, when the error correction decoding fails, recovery of the original data may be possible only operating at a relatively low speed/high power. This may be a method of easily recovering the original data when the read failed due to environmental factors irrelevant to a change of the threshold voltage of the memory cell.

FIG. 5 is a diagram illustrating the memory device 100 of FIG. 1.

Referring to FIG. 5, the memory device 100 may include a memory cell array 110, a voltage generator 120, an address decoder 130, an input/output (I/O) circuit 140, and a control logic 150. The control logic 150 may further include a read mode register 151.

The memory cell array 110 includes a plurality of memory blocks BLK1 to BLKi, which are connected to the address decoder 130 through row lines RL. The plurality of memory blocks BLK1 to BLKi may be connected to the input/output circuit 140 through column lines CL. In an embodiment, the row lines RL may include word lines, source select lines, and drain select lines. In an embodiment, the column lines CL may include bit lines.

Each of the plurality of memory blocks BLK1 to BLKi includes a plurality of memory cells. In an embodiment, the plurality of memory cells may be non-volatile memory cells. Memory cells connected to the same word line among the plurality of memory cells may be defined as one physical page. That is, the memory cell array 110 may include a plurality of physical pages. Each of the memory cells of the memory device 100 may be configured as a single level cell (SLC) that stores one bit of data, a multi-level cell (MLC) that stores two bits of data, a triple level cell (TLC) that stores three bits of data, or a quad level cell (QLC) capable of storing four bits of data.

In an embodiment, the voltage generator 120, the address decoder 130, and the input/output circuit 140 may be collectively referred to as a peripheral circuit. The peripheral circuit may drive the memory cell array 110 under control of the control logic 150. The peripheral circuit may drive the memory cell array 110 to perform the program operation, the read operation, and the erase operation.

The voltage generator 120 is configured to generate a plurality of operation voltages Vop using an external power voltage supplied to the memory device 100. The voltage generator 120 operates in response to the control of the control logic 150.

In an embodiment, the voltage generator 120 may generate an internal power voltage by regulating the external power voltage. The internal power voltage generated by the voltage generator 120 is used as an operation voltage of the memory device 100.

In an embodiment, the voltage generator 120 may generate the plurality of operation voltages using an external power voltage or an internal power voltage. The voltage generator 120 may be configured to generate various voltages required in the memory device 100. For example, the voltage generator 120 may generate a plurality of erase voltages, a plurality of program voltages, a plurality of pass voltages, a plurality of selected read voltages, and a plurality of unselected read voltages.

The voltage generator 120 may include a plurality of pumping capacitors that receive the internal power voltage to generate the plurality of operation voltages having various voltage levels. The voltage generator 120 may generate the plurality of operation voltages by selectively activating the plurality of pumping capacitors in response to the control of the control logic 150.

The generated plurality of operation voltages may be supplied to the memory cell array 110 by the address decoder 130.

The address decoder 130 is connected to the memory cell array 110 through the row lines RL. The address decoder 130 is configured to operate in response to the control of the control logic 150. The address decoder 130 may receive an address ADDR from the control logic 150. The address decoder 130 may decode a block address among the received addresses ADDR. The address decoder 130 selects at least one memory block among the memory blocks BLK1 to BLKi according to the decoded block address. The address decoder 130 may decode a row address among the received addresses ADDR. The address decoder 130 may select at least one word line among word lines of a selected memory block according to the decoded row address. In an embodiment, the address decoder 130 may decode a column address among the received addresses ADDR. The address decoder 130 may connect the input/output circuit 140 and the memory cell array 110 to each other according to the decoded column address.

According to an embodiment of the present disclosure, during the read operation, the address decoder 130 may apply the read voltage to a selected word line, and apply a read pass voltage having a level higher than that of the read voltage to unselected word lines.

For example, the address decoder 130 may include components such as a row decoder, a column decoder, and an address buffer.

The input/output circuit 140 may include a plurality of page buffers, which may be connected to the memory cell array 110 through the bit lines. During the program operation, data in the plurality of page buffers may be stored in selected memory cells.

During the read operation, the data stored in the selected memory cells may be sensed through the bit lines, and the sensed data may be stored in the page buffers.

The control logic 150 may control the address decoder 130, the voltage generator 120, and the input/output circuit 140. The control logic 150 may operate in response to the command CMD received from an external device (e.g., the memory controller 200). The control logic 150 may generate various signals in response to the command CMD and the address ADDR to control the peripheral circuit.

In an embodiment of the present disclosure, the control logic 150 may further include the read mode register 151. The control logic 150 may change a value of the read mode register 151 in response to a set feature command input from the memory controller 200. For example, the control logic 150 may store data corresponding to read operation mode information input together with the set feature command in the read mode register 151. Various settings of the memory device 100 may be set according to the value stored in the read mode register 151.

FIG. 6 is a diagram illustrating the read mode register 151 of FIG. 5.

Referring to FIG. 6, the read mode register 151 may store the data interface information, the external power information that is the information on the magnitude of the external voltage input to the memory device 100, and the internal power information that is the information on the magnitude of the internal voltage to be generated by the memory device 100. In FIG. 6, only the data interface information, the external power information, and the internal power information are stored in the read mode register 151. However, the present invention is not limited to this configuration, that is, the read mode information may be stored in another component having storage capability.

Here, the information on the data interface may be a single data rate (SDR) or a double data rate (DDR). In various embodiments, the information on the data interface may include a double data rate 2 (DDR2) or a double data rate 3 (DDR3).

Regarding the external voltage information and the internal voltage information, the memory device 100 may be configured to operate in response to two or more input voltages. Therefore, a configuration of an internal voltage generation circuit may be changed according to a voltage of the input external voltage.

Figure 7:
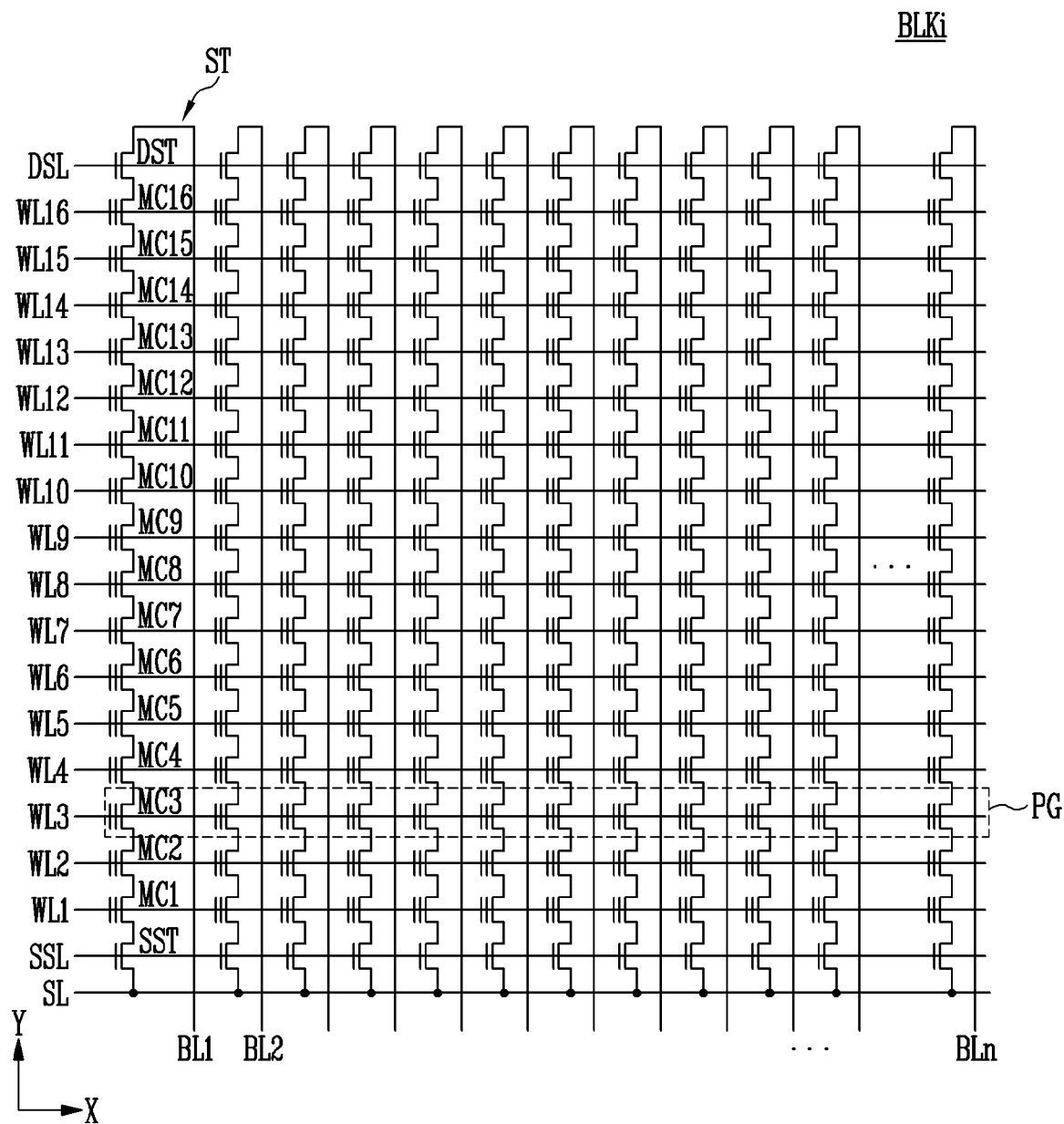
FIG. 7 is a diagram illustrating a configuration of a memory block, which may be any memory block of FIG. 5, according to an embodiment.

FIG. 7 is a diagram illustrating a configuration of a representative memory block BLKi of the memory blocks of FIG. 5.

Referring to FIG. 7, a plurality of word lines arranged in parallel with each other may be connected between the first select line and the second select line. Here, the first select line may be the source select line SSL, and the second select line may be the drain select line DSL. More specifically, the memory block 110 may include a plurality of strings ST connected between the bit lines BL1 to BLn and the source line SL. The bit lines BL1 to BLn may be connected to the strings ST, respectively, and the source line SL may be commonly connected to the strings ST. Since each of the strings ST may be configured the same, a string ST connected to the first bit line BL1 is specifically described, as an example.

The string ST may include a source select transistor SST, a plurality of memory cells MC1 to MC16, and a drain select transistor DST connected in series between the source line SL and the first bit line BL1. One string ST may include at least one of the source select transistor SST and the drain select transistor DST, and may include more than the 16 memory cells MC1 to MC16 shown in the figure.

A source of the source select transistor SST may be connected to the source line SL and a drain of the drain select transistor DST may be connected to the first bit line BL1. The memory cells MC1 to MC16 may be connected in series between the source select transistor SST and the drain select transistor DST. Gates of the source select transistors SST in the different strings ST may be connected to the source select line SSL, gates of the drain select transistors DST may be connected to the drain select line DSL, and gates of the memory cells MC1 to MC16 may be connected to the plurality of word lines WL1 to WL16. A group of the memory cells connected to the same word line among the memory cells in different strings ST may be referred to as a page PG. Therefore, the memory block BLKi may include the same number of pages PG as word lines WL1 to WL16.

One memory cell may store one bit of data. This is commonly called a single level cell (SLC). In this case, one physical page PG may store one logical page (LPG) of data. The one logical page (LPG) of data may include the same number of data bits as there are cells in one physical page PG.

One memory cell may store two or more bits of data. In this case, one physical page PG may store two or more logical pages (LPG) of data.

Figure 8:
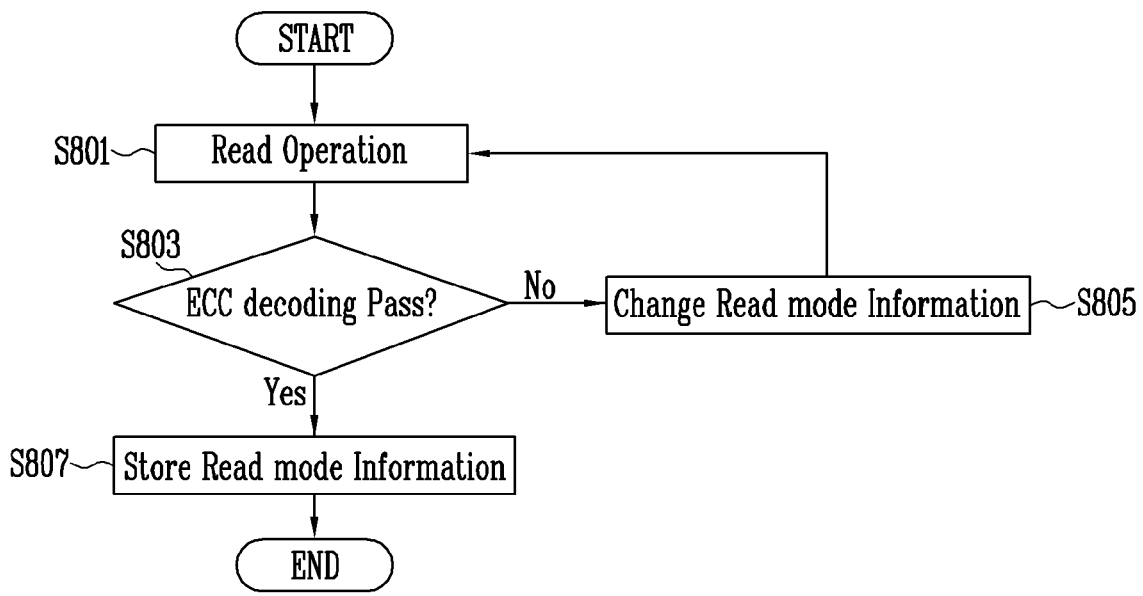
FIG. 8 is a flowchart illustrating a method operating the storage device according to an embodiment of the present disclosure.

FIG. 8 is a flowchart illustrating a method of operating a storage device (e.g., the storage device 50 of FIG. 1) according to an embodiment of the present disclosure.

Referring to FIG. 8, in step S801, the storage device may perform the read operation.

In step S803, the storage device may determine whether error correction (ECC) decoding passed (or succeeded) with respect to the data sensed by the read operation. When it is determined that the error correction decoding failed (S803, No), the method proceeds to step S805.

In step S805, the storage device may change the read mode information. For example, the storage device may change the read mode information so that a memory controller (e.g., the memory controller 200) and a memory device (e.g., the memory device 100) communicate in the SDR mode, which is slower than in the DDR mode. Alternatively, the storage device may change the read mode information to increase a level of the external voltage input to the memory device. Alternatively, the storage device may change the read mode information to increase a level of the internal voltage to be generated by the memory device. After changing the read mode information, the storage device may proceed to step S801 to perform the read operation again using the changed read mode information.

When it is determined that error correction decoding passed (S803, Yes), the method proceeds to step S807. In step S807, the storage device may store the read mode information of a case where the error correction decoding is succeeded.

Figure 9:
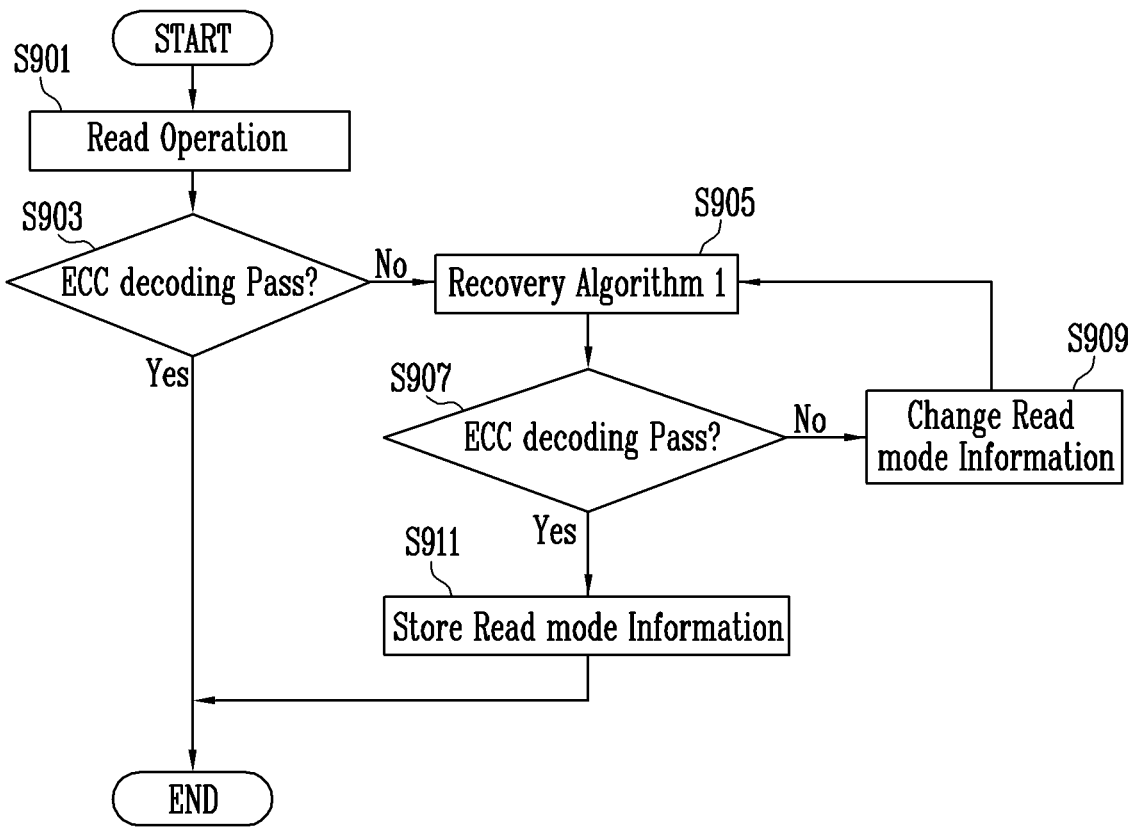
FIG. 9 is a flowchart illustrating a method of operating the storage device according to another embodiment of the present disclosure.

FIG. 9 is a flowchart illustrating a method of operating a storage device (e.g., the storage device 50 of FIG. 1) according to another embodiment of the present disclosure.

Referring to FIG. 9, in step S901, the storage device may perform the read operation.

In step S903, the storage device may determine whether the error correction (ECC) decoding passed (or succeeded) with respect to the data sensed by the read operation. When it is determined that the error correction decoding passed (S903, Yes), the operation ends. When the error correction decoding is determined to have failed (S903, No), the method proceeds to step S905.

In step S905, the storage device may perform the read operation using a first recovery algorithm Recovery Algorithm 1. In an embodiment, the first recovery algorithm may be the read retry. The read retry may include an operation of retrying the read operation using a read voltage different from the default read voltage used in the previous try. The read voltage used in the read retry may be stored in the memory device 100 or the memory controller 200 in advance.

In step S907, the storage device may determine whether the error correction (ECC) decoding operation passed with respect to the data read according to the read retry. As a result of the determination, when the error correction decoding failed (S907, No), the method proceeds to step S909.

In step S909, the storage device may change the read mode information. For example, the storage device may change the read mode information so that the memory controller and the memory device communicate in the SDR mode, which is slower than in the DDR mode. Alternatively, the storage device may change the read mode information to increase the level of the external voltage input to the memory device. Alternatively, the storage device may change the read mode information to increase the level of the internal voltage to be generated by the memory device. After changing the read mode information, the storage device may proceed to step S905 to perform the read operation again.

In step S911, the storage device may store the read mode information of a case where the error correction decoding is passed.

According to the embodiment of FIG. 9, the storage device may perform the recovery algorithm without changing the read mode information in step S903 where a read fail occurs, differently from the embodiment of FIG. 8. That is, the change of the read mode information may be applied when the error correction decoding according to the read operation failed or when the error correction decoding according to the recovery algorithm failed, or may be selectively applied.

Figure 10:
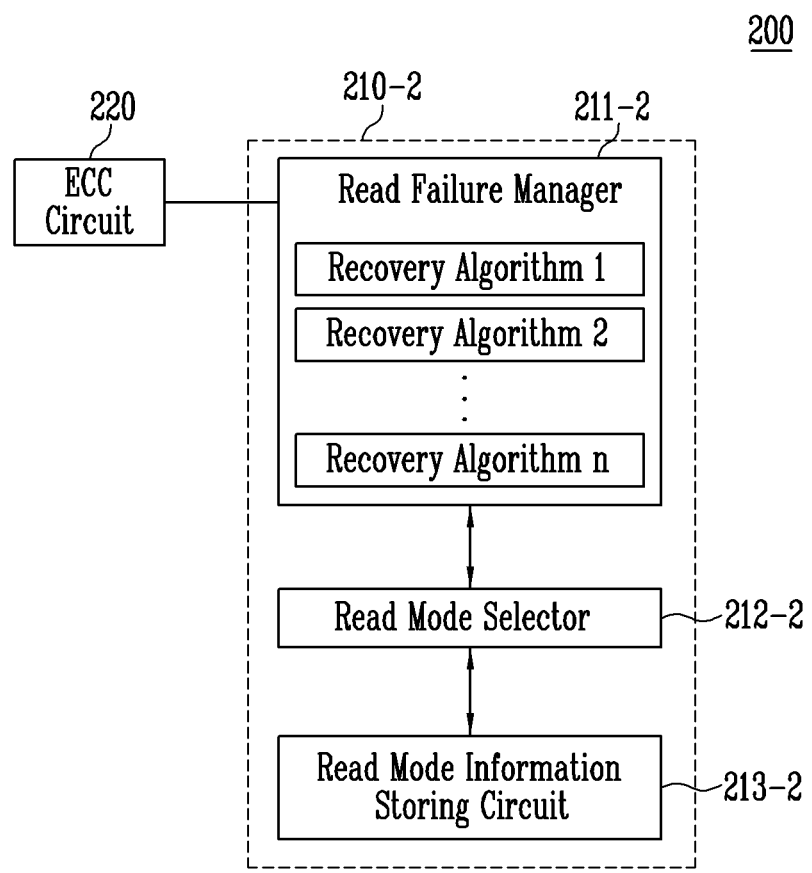
FIG. 10 is a diagram illustrating another embodiment of the read controller of FIG. 1.

FIG. 10 is a diagram illustrating another embodiment of the read controller in the memory controller 200 of FIG. 1.

Referring to FIG. 10, the read controller 210-2 may include a read failure manager 211-2, a read mode selector 212-2, and a read mode information storing circuit 213-2. A difference between the embodiment of FIG. 10 and the embodiment of FIG. 3 is whether the read failure manager 211-2 sequentially performs the recovery algorithms when the error correction decoding for data obtained by the read operation fails. The read failure manager 211-2 may sequentially perform a plurality of recovery algorithms, from Recovery Algorithm 1 to Recovery Algorithm n, stored in advance.

In the embodiment of FIG. 10, the read failure manager 211-2 may perform the recovery algorithm and also change the read mode information in a particular set of steps.

Figure 11:
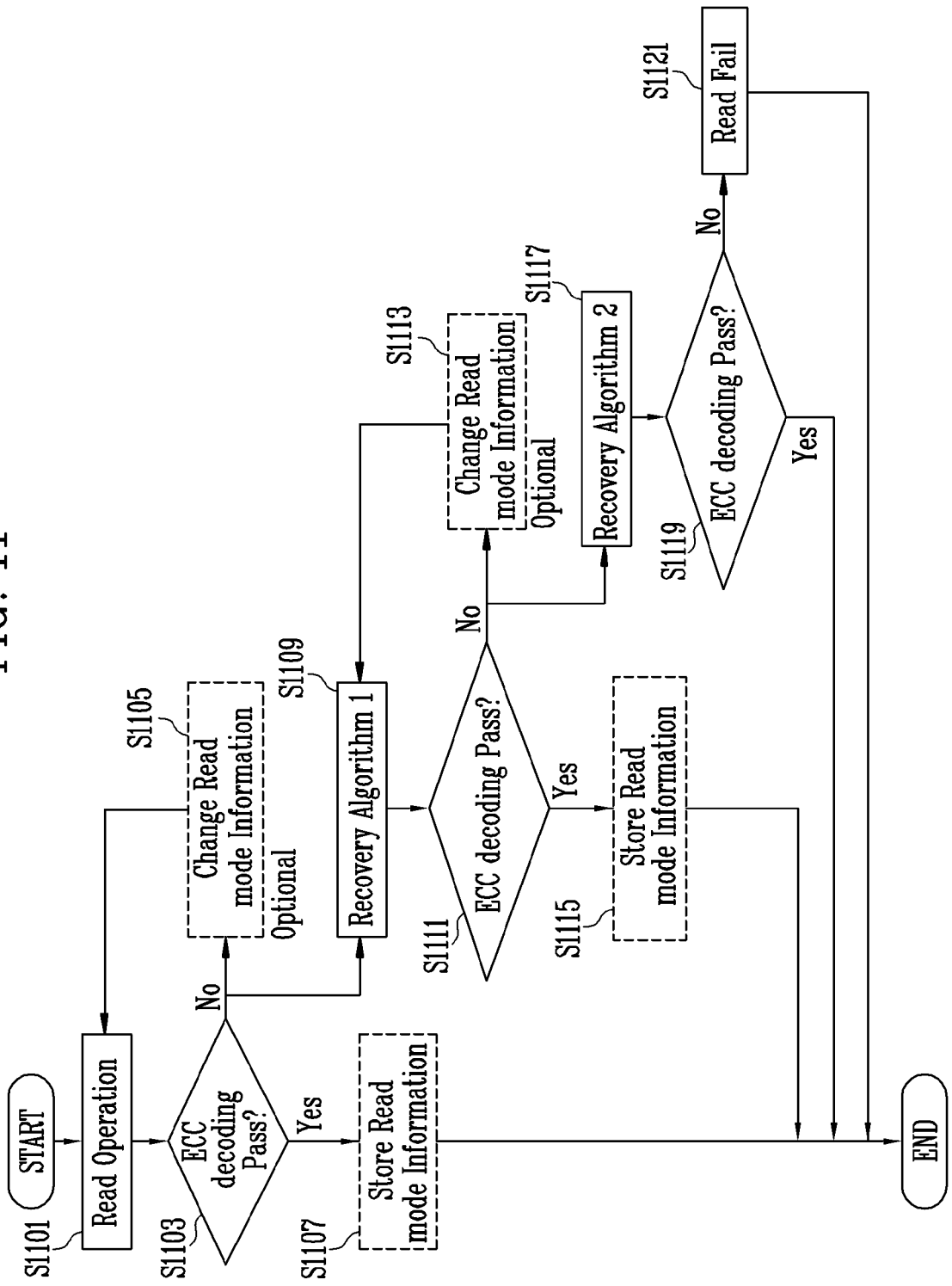
FIG. 11 is a flowchart illustrating a method of operating the storage device according to another embodiment of the present disclosure.

FIG. 11 is a flowchart illustrating a method of operating a storage device (e.g., the storage device 50 of FIG. 1) according to another embodiment of the present disclosure.

Referring to FIG. 11, in step S1101, the storage device may perform the read operation.

In step S1103, the storage device may determine whether the error correction (ECC) decoding passed (or succeeded) with respect to the data sensed by the read operation. When it is determined that the error correction decoding failed (S1103, No), the method proceeds to step S1105.

In step S1105, as in the embodiment of FIG. 8, the storage device may change the read mode information and retry the read operation. For example, the storage device may change the read mode information so that the memory controller and the memory device communicate in the SDR mode, which is slower than in the DDR mode. Alternatively, the storage device may change the read mode information to increase the level of the external voltage input to the memory device. Alternatively, the storage device may change the read mode information to increase the level of the internal voltage to be generated by the memory device.

Alternatively, the storage device may proceed to step S1109 and immediately perform the first recovery algorithm Recovery Algorithm 1 without retrying the read operation.

In step S1109, the storage device may perform the read operation using the first recovery algorithm. In an embodiment, the first recovery algorithm may be the read retry. The read retry may include an operation of retrying the read operation using a read voltage different from the default read voltage used initially. The read voltage used in the read retry may be stored in the memory device 100 or the memory controller 200 in advance.

In step S1111, the storage device may determine whether the error correction (ECC) decoding operation passed with respect to the data read according to the read retry. As a result of the determination, when the error correction decoding failed (S1111, No), the method proceeds to step S1113.

In step S1113, the storage device may change the read mode information. For example, the storage device may change the read mode information so that the read operation may be performed based on read mode information different from the read mode information changed in step S1105.

Alternatively, the storage device may proceed to step S1117 to immediately perform a second recovery algorithm Recovery Algorithm 2 without retrying the read operation.

In an embodiment, the second recovery algorithm may be the optimum read voltage retry operation.

The optimum read voltage retry operation may include an operation of calculating the optimum read voltage and performing the read operation using the calculated optimum read voltage. Here, the optimum read voltage may be calculated by various methods. In an embodiment, the optimum read voltage may be calculated using Gaussian modeling. Alternatively, the optimum read voltage may be calculated according to the number of 0's and 1's in the data read using the plurality of read voltages.

In step S1119, the storage device may determine whether the error correction (ECC) decoding operation passed with respect to the data read according to the optimum read voltage retry operation. As a result of the determination, when the error correction decoding failed, the method proceeds to step S1121 (S1119, No).

In an embodiment, step S1107 may be performed only when step S1105 is performed, and step S1115 may be performed only when step S1113 is performed.

According to the embodiment of FIG. 11, the storage device may change the read mode information and also perform at least one of a plurality of recovery algorithms. The read mode information may be changed before or after a recovery algorithm is performed.

FIG. 12 is a diagram illustrating another embodiment of the read mode information storing circuit of FIG. 3 or FIG. 10.

Referring to FIG. 12, third read mode information 213-3 may include read mode information corresponding to each of physical addresses of memory areas in the memory device.

In an embodiment, the physical addresses of the memory areas may be a page unit, a block unit, or a plane unit.

In addition, each entry of the third read mode information 213-3 may include one of the plurality of recovery algorithms. For example, read mode information identifying a second recovery algorithm operation RA2 to be performed may be stored with respect to a first physical address PA1.

When the read mode information is managed as the third read mode information 213-3, the storage device 50 may selectively perform the recovery algorithm according to the read mode information through which the error correction decoding previously passed, or may perform the read operation using optimal read mode information according to the physical address.

Figure 13:
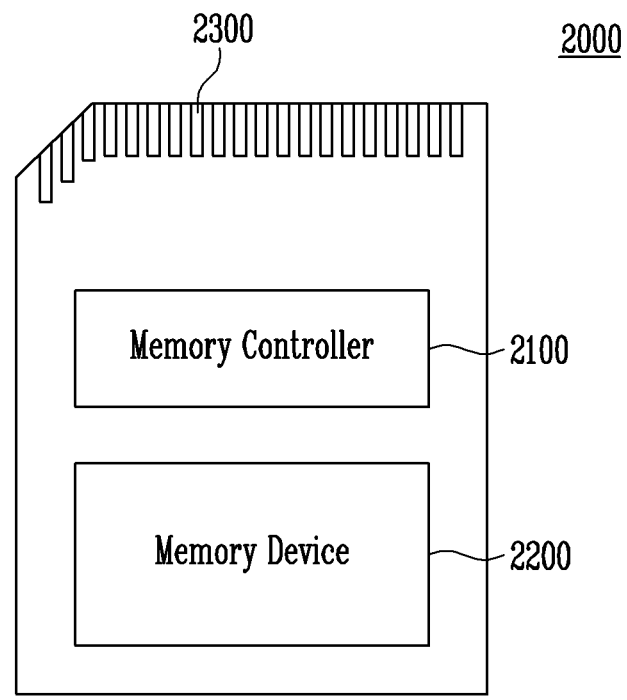
FIG. 13 is a block diagram illustrating a memory card system to which the storage device is applied according to an embodiment of the present disclosure.

FIG. 13 is a block diagram illustrating a memory card system 2000 to which the storage device is applied according to an embodiment of the present disclosure.

Referring to FIG. 13, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 may be configured to control read, write, erase, and background operations of the memory device 2200. The memory controller 2100 is configured to provide an interface between the memory device 2200 and a host. The memory controller 2100 is configured to drive firmware for controlling the memory device 2200. The memory controller 2100 may be configured the same as the memory controller 200 described with reference to FIG. 1.

For example, the memory controller 2100 may include components such as a random access memory (RAM), a processor, a host interface, a memory interface, and an error corrector.

The memory controller 2100 may communicate with an external device through the connector 2300. The memory controller 2100 may communicate with an external device (for example, the host) according to a specific communication standard. For example, the memory controller 2100 is configured to communicate with an external device through at least one of various communication standards such as a universal serial bus (USB), a multimedia card (MMC), an embedded MMC (eMMC), a peripheral component interconnection (PCI), a PCI express (PCI-e or PCIe), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and/or an NVMe. For example, the connector 2300 may be defined by at least one of the various communication standards described above.

For example, the memory device 2200 may be configured as any of various non-volatile memories, such as an electrically erasable and programmable ROM (EEPROM), a NAND flash memory, a NOR flash memory, a phase-change RAM (PRAM), a resistive RAM (ReRAM), a ferroelectric RAM (FRAM), and/or a spin transfer torque magnetic RAM (STT-MRAM).

The memory controller 2100 and the memory device 2200 may be integrated into one semiconductor device to configure a memory card, such as a PC card (personal computer memory card international association (PCMCIA)), a compact flash (CF) card, a smart media card (e.g., SM or SMC), a memory stick, a multimedia card (e.g., MMC, RS-MMC, MMCmicro, or eMMC), a secure digital (SD) card (e.g., SD, miniSD, microSD, or SDHC), and/or a universal flash storage (UFS).

Figure 14:
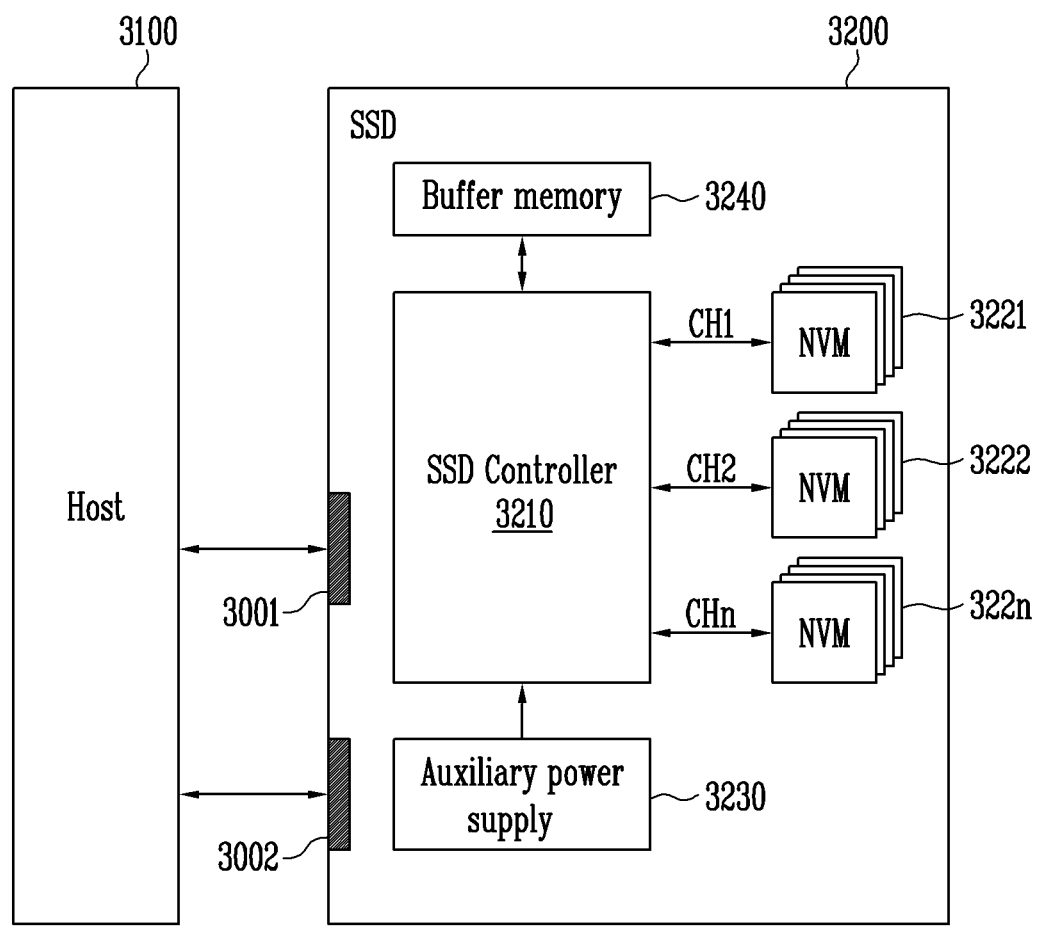
FIG. 14 is a block diagram illustrating a solid state drive (SSD) system to which the storage device is applied according to an embodiment of the present disclosure.

FIG. 14 is a block diagram illustrating a solid state drive (SSD) system 3000 to which the storage device is applied according to an embodiment of the present disclosure.

Referring to FIG. 14, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

According to an embodiment of the present disclosure, the SSD controller 3210 may be configured to function the same as the memory controller 200 described with reference to FIG. 1.

The SSD controller 3210 may control the plurality of flash memories 3221 to 322n in response to the signal SIG received from the host 3100. For example, the signal SIG may be signals based on an interface between the host 3100 and the SSD 3200. For example, the signal SIG may be defined by at least one of interfaces such as a universal serial bus (USB), a multimedia card (MMC), an embedded MMC (eMMC), a peripheral component interconnection (PCI), a PCI express (PCI-e or PCIe), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and/or an NVMe.

The auxiliary power device 3230 is connected to the host 3100 through the power connector 3002. The auxiliary power device 3230 may receive the power PWR from the host 3100 and thus may be charged. The auxiliary power device 3230 may provide power of the SSD 3200 when power supply from the host 3100 is not smooth. For example, the auxiliary power device 3230 may be disposed within or externally to the SSD 3200. For example, the auxiliary power device 3230 may be disposed on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-MRAM, and/or a PRAM.

Figure 15:
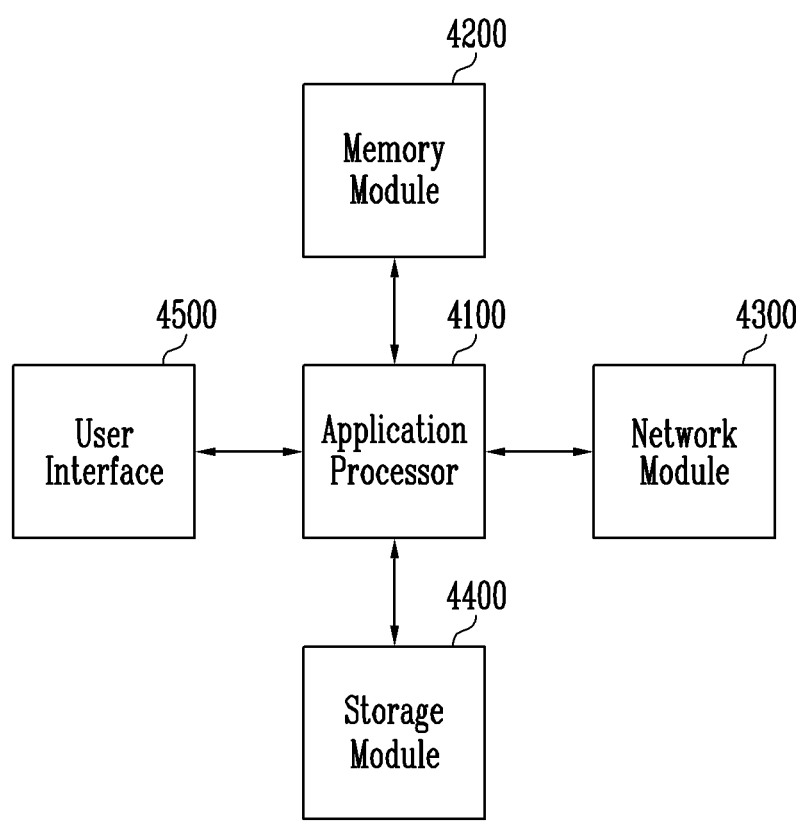
FIG. 15 is a block diagram illustrating a user system to which the storage device is applied according to an embodiment of the present disclosure.

FIG. 15 is a block diagram illustrating a user system 4000 to which the storage device is applied according to an embodiment of the present disclosure.

Referring to FIG. 15, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a non-volatile random access memory, such as a PRAM, a ReRAM, an MRAM, and/or an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a non-volatile semiconductor memory such as a phase-change RAM (PRAM), a magnetic RAM (MRAM), a resistive RAM (RRAM), a NAND flash, a NOR flash, and/or a three-dimensional NAND flash. For example, the storage module 4400 may be provided as a removable storage device (removable drive), such as a memory card, and an external drive of the user system 4000.

For example, the storage module 4400 may include a plurality of non-volatile memory devices, each of which may operate identically to the memory device 100 described with reference to FIG. 1. The storage module 4400 may operate identically to the storage device 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and/or a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

While the present invention has been shown and described with reference to certain embodiments thereof, those skilled in the art will understand that various changes and/or modifications in form and details may be made to any of the disclosed embodiments without departing from the spirit and scope of the present invention.

For example, not all steps need be performed in the stated order, and in some cases, one or more steps may be omitted. Also, specific terminology used herein is intended to explain the embodiments of the present disclosure, not to limit the invention. Thus, the present invention embraces all changes and variations to the extent they fall within the scope of the claims.

What is claimed is:

1. A storage device comprising:
a memory device including a plurality of memory cells, and configured to perform a read operation on data stored in the plurality of memory cells according to read mode information, and to output read data associated with the read operation; and
a memory controller configured to receive the read data, change the read mode information when error correction decoding for the read data fails, and control the memory device to perform the read operation again according to the changed read mode information,
wherein the memory controller comprises an error correction circuit configured to perform the error correction decoding; a read mode information storing circuit storing read mode information respectively corresponding to a plurality of read mode items; and a read mode selector configured to provide changed read mode information corresponding to a read mode item to be changed among the plurality of read mode items to the memory device in response to failure of the error correction decoding.

2. The storage device of claim 1, wherein the read mode information includes external power information indicating a magnitude of an external voltage input to the memory device.

3. The storage device of claim 1, wherein the read mode information includes internal power information indicating a magnitude of an internal voltage to be generated by the memory device.

4. The storage device of claim 1, wherein the read mode selector controls the read mode information storing circuit to store the changed read mode information.

5. The storage device of claim 1, wherein the memory device includes a read mode register that stores the changed read mode information, and
the memory controller further includes a read failure manager that controls the memory device to transmit the read data again according to the changed read mode information.

6. The storage device of claim 1, wherein the memory device includes a read mode register that stores the changed read mode information, and
the memory controller further includes a read failure manager that controls the memory device to perform the read operation again according to the changed read mode information and output re-read data associated with the read operation performed again.

7. The storage device of claim 1, wherein the read mode selector resets the memory device before providing the changed read mode information to the memory device.

8. The storage device of claim 1, wherein the read mode information includes information on a data interface between the memory device and the memory controller.

9. The storage device of claim 8, wherein the information on the data interface includes information indicating any of a single data rate mode or a double data rate mode.

10. A storage device comprising:
a memory device including a memory block including a plurality of pages, and configured to perform a read operation on a selected page among the plurality of pages according to read mode information, and to output read data associated with the read operation; and
a memory controller configured to receive the read data and control the memory device to sequentially performing a plurality of recovery algorithms for recovering data stored in the selected page according to a set sequence when error correction decoding for the read data fails,
wherein the memory controller controls the memory device to change the read mode information while at least one of the plurality of recovery algorithms is performed.

11. The storage device of claim 10, wherein the read mode information includes information on a data interface between the memory device and the memory controller.

12. The storage device of claim 11, wherein the information on the data interface includes information indicating any of a single data rate mode or a double data rate mode.

13. The storage device of claim 10, wherein the read mode information includes external power information indicating a magnitude of an external voltage input to the memory device.

14. The storage device of claim 10, wherein the read mode information includes internal power information indicating a magnitude of an internal voltage to be generated by the memory device.

15. The storage device of claim 10, wherein read mode information includes setting information related to the memory device excluding a read voltage used in sensing the selected page while the read operation is initially performed.

16. The storage device of claim 10, wherein the plurality of recovery algorithms are performed in a sequence from a recovery algorithm of which an amount of computations to be processed is relatively small to a recovery algorithm of which the amount of computations to be processed is relatively large.

17. The storage device of claim 10, wherein the memory controller comprises:

an error correction circuit configured to perform the error correction decoding;

a read mode information storing circuit storing read mode information respectively corresponding to a plurality of read mode items;

a read mode selector configured to provide changed read mode information corresponding to a read mode item to be changed among the plurality of read mode items to the memory device in response to failure of the error correction decoding; and a read failure manager configured to control the memory device to sequentially perform the plurality of recovery algorithms in a set sequence according to the changed read mode information.

18. The storage device of claim 17, wherein the read mode information storage includes read mode information respectively corresponding to physical addresses of the memory device.

19. The storage device of claim 17, wherein the read mode information storage includes read mode information corresponding to a performed recovery algorithm among the plurality of recovery algorithms.

20. The storage device of claim 10, wherein the plurality of recovery algorithms includes at least one of read retry including retrying the read operation using a read voltage different from a default read voltage previously used, optimum read voltage retry including calculating an optimum read voltage and performing the read operation using the calculated optimum read voltage, soft decoding including performing read operations using a plurality of soft read voltages, and a chip kill recovery operation including recovering data stored in a page where the read operation is failed using data of other pages.

* * * * *